(12) United States Patent
Lin et al.

(10) Patent No.: US 11,276,581 B2
(45) Date of Patent: Mar. 15, 2022

(54) TEXTILE PATTERNING FOR SUBTRACTIVELY-PATTERNED SELF-ALIGNED INTERCONNECTS, PLUGS, AND VIAS

(71) Applicant: Intel Corporation, Santa Clara, CA (US)

(72) Inventors: Kevin Lin, Beaverton, OR (US); Robert Lindsey Bristol, Portland, OR (US); Alan M. Myers, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/435,240

(22) Filed: Jun. 7, 2019

(65) Prior Publication Data
US 2019/0287813 A1      Sep. 19, 2019

Related U.S. Application Data

(62) Division of application No. 15/575,283, filed as application No. PCT/US2015/038145 on Jun. 26, 2015, now Pat. No. 10,366,903.

(51) Int. Cl.
*H01L 21/32* (2006.01)
*H01L 21/3213* (2006.01)
(Continued)

(52) U.S. Cl.
CPC .... *H01L 21/32139* (2013.01); *H01L 21/0337* (2013.01); *H01L 21/76801* (2013.01);
(Continued)

(58) Field of Classification Search
CPC ............... H01L 21/0337; H01L 21/027; H01L 21/0274; H01L 21/0332
See application file for complete search history.

(56) References Cited

U.S. PATENT DOCUMENTS 9,041,217 B1    5/2015   Bristol et al.
2009/0206483 A1 8/2009   O'Brien
(Continued)

FOREIGN PATENT DOCUMENTS

CN       1044991 A       8/1990
CN     104335021 A       2/2015
(Continued)

OTHER PUBLICATIONS

Office Action from Taiwan Patent Application No. 105115533, dated Dec. 17, 2019, 7 pgs.
(Continued)

*Primary Examiner* — Fernando L Toledo
*Assistant Examiner* — Valerie N Newton
(74) *Attorney, Agent, or Firm* — Schwabe, Williamson & Wyatt, P.C.

(57) ABSTRACT

Embodiments of the invention include methods of forming a textile patterned hardmask. In an embodiment, a first hardmask and a second hardmask are formed over a top surface of an interconnect layer in an alternating pattern. A sacrificial cross-grating may then be formed over the first and second hardmasks. In an embodiment, portions of the first hardmask that are not covered by the sacrificial cross-grating are removed to form first openings and a third hardmask is disposed into the first openings. Embodiments may then include etching through portions of the second hardmask that are not covered by the sacrificial cross-grating to form second openings. The second openings may be filled with a fourth hardmask. According to an embodiment, the first, second, third, and fourth hardmasks are etch selective to each other. In an embodiment the sacrificial cross-grating may then be removed.

6 Claims, 10 Drawing Sheets

(51) Int. Cl.
  *H01L 21/768* (2006.01)
  *H01L 21/033* (2006.01)
  *H01L 23/522* (2006.01)

(52) U.S. Cl.
  CPC .. *H01L 21/76816* (2013.01); *H01L 21/76829* (2013.01); *H01L 21/76834* (2013.01); *H01L 21/76885* (2013.01); *H01L 21/76897* (2013.01); *H01L 23/5226* (2013.01); *H01L 2224/16225* (2013.01)

(56) References Cited

U.S. PATENT DOCUMENTS

| | | | |
|---|---|---|---|
| 2010/0187658 A1* | 7/2010 | Wei | H01L 21/3088 257/618 |
| 2011/0076845 A1 | 3/2011 | Tsai et al. | |
| 2014/0242794 A1 | 8/2014 | Lin et al. | |
| 2015/0166942 A1 | 6/2015 | Kang | |
| 2015/0171010 A1 | 6/2015 | Bristol et al. | |
| 2015/0179513 A1* | 6/2015 | Myers | H01L 21/76883 257/774 |

FOREIGN PATENT DOCUMENTS

WO  WO 2015-047318  4/2015
WO  WO 2015-047320  4/2015

OTHER PUBLICATIONS

Office Action from Taiwan Patent Application No. 105115533, dated Jan. 7, 2020 2 pgs.
Search Report from European Patent Application No. 15896576.4, dated Jan. 21, 2019, 9 pgs.
International Search Report and Written Opinion for International Patent Application No. PCT/US2015/038145 dated Mar. 25, 2016, 11 pgs.
International Preliminary Report on Patentability for International Patent Application No. PCT/US2015/038145, dated Jan. 4, 2018, 8 pages.
Office Action from Chinese Patent Application No. 201580080374. 1, dated May 7, 2021, 8 pgs.
Office Action from Korean Patent Application No. 10-2018-7002080, dated Oct. 27, 2021, 9 pgs.
Notice of Allowance from Chinese Patent Application No. 201580080374.1, dated Nov. 17, 2021, 4 pgs.

* cited by examiner

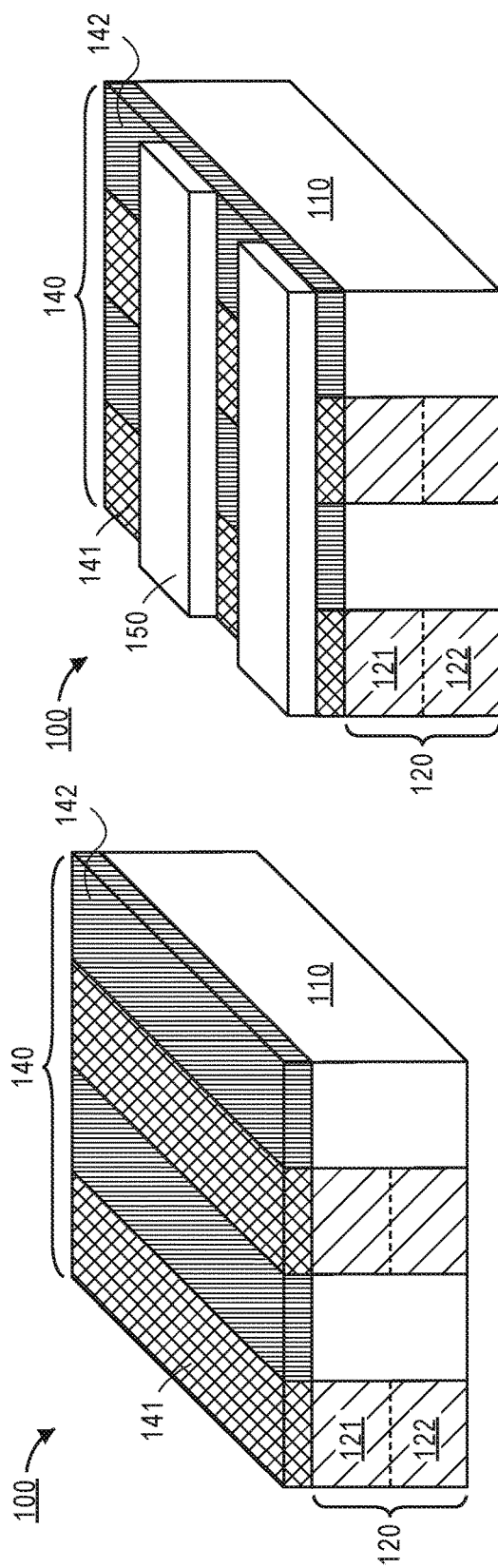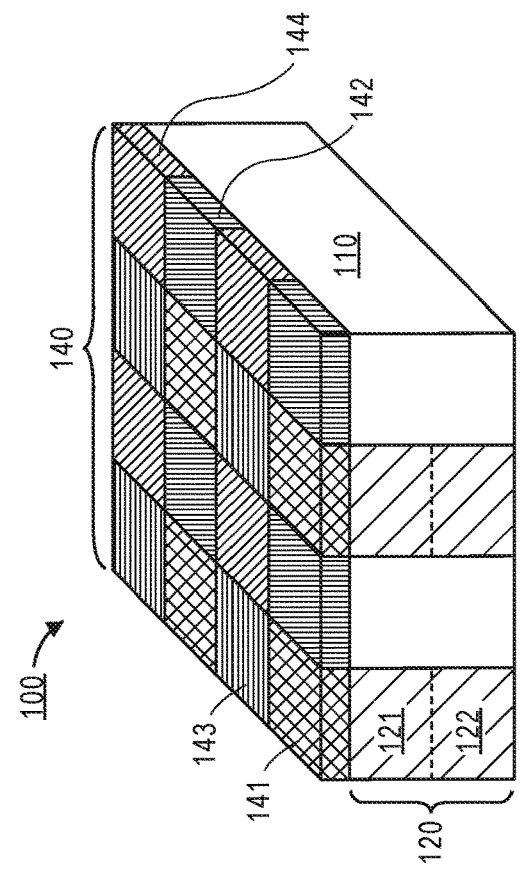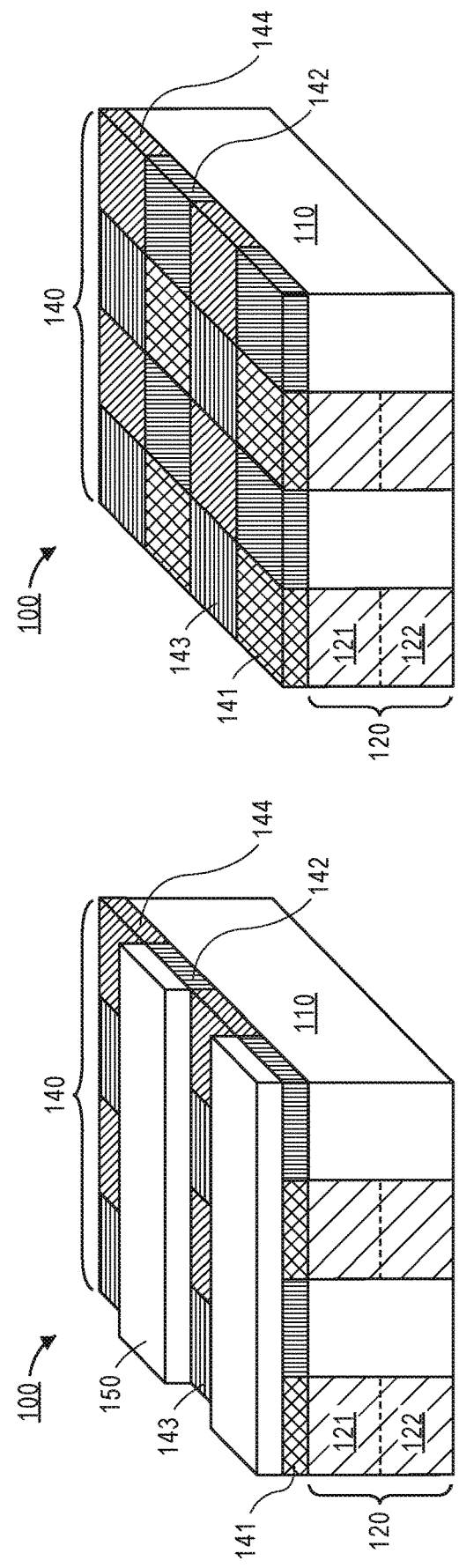
FIG. 1A
FIG. 1B
FIG. 1C
FIG. 1D

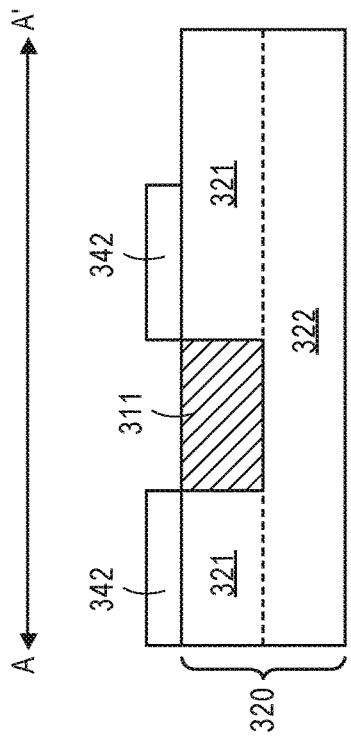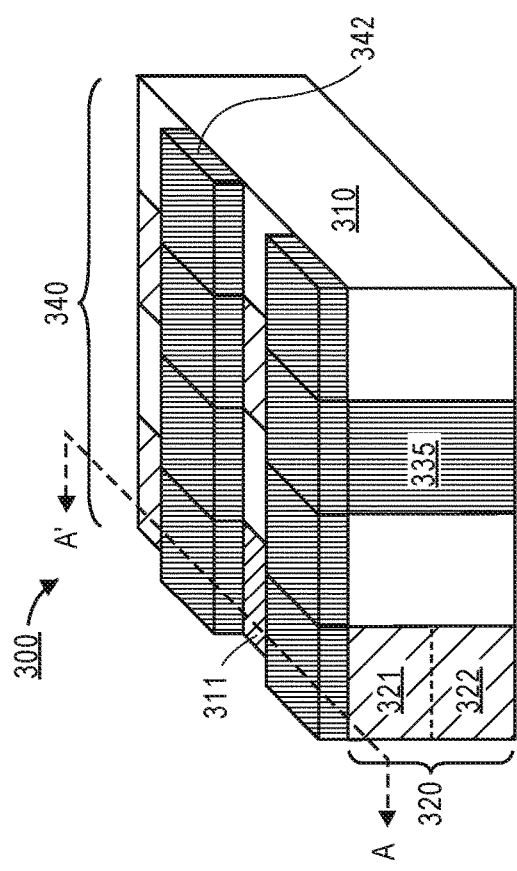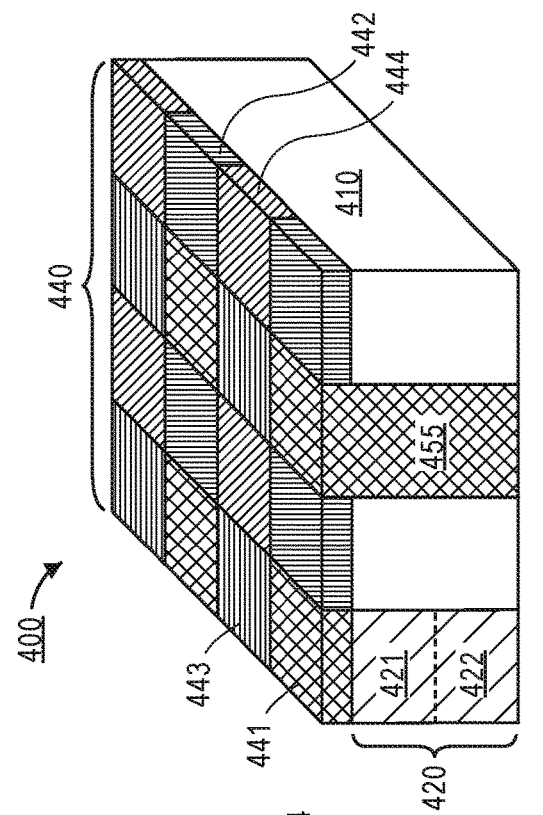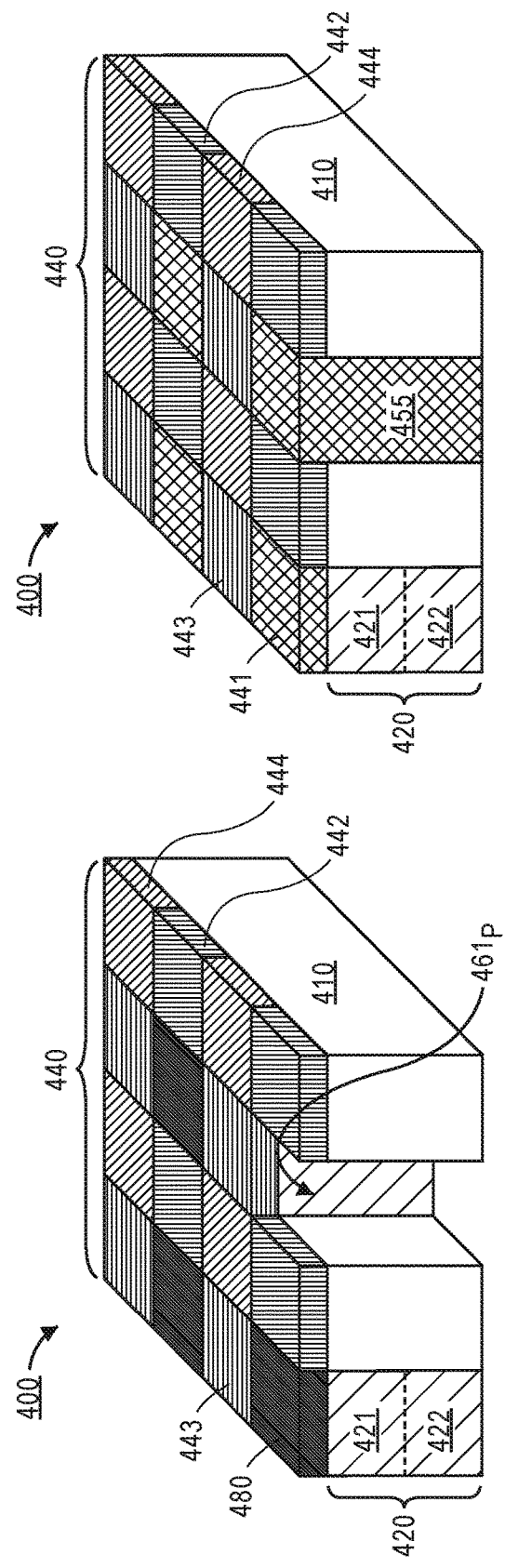

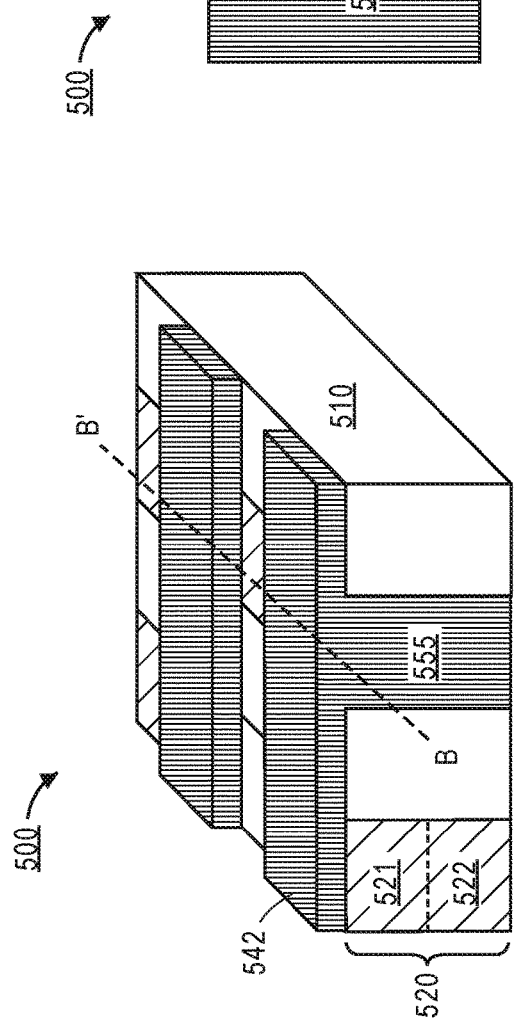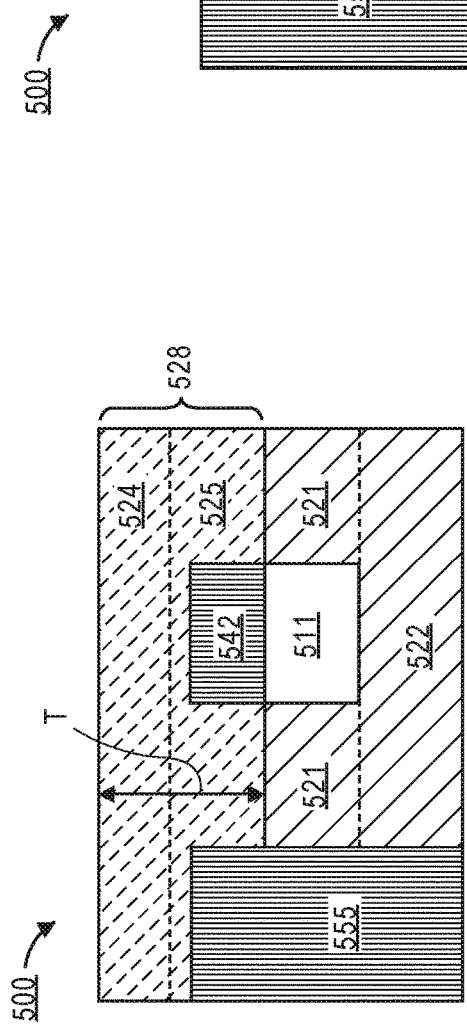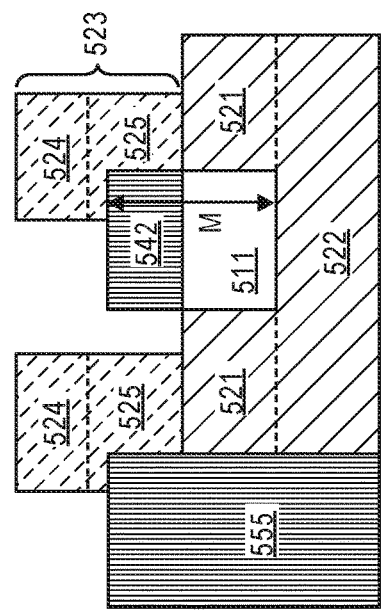

TEXTILE PATTERNING FOR SUBTRACTIVELY-PATTERNED SELF-ALIGNED INTERCONNECTS, PLUGS, AND VIAS

CROSS-REFERENCE TO RELATED APPLICATION

This patent application is a divisional of U.S. patent application Ser. No. 15/575,283, filed Nov. 17, 2017, which is a U.S. National Phase Application under 35 U.S.C. § 371 of International Application No. PCT/US2015/038145, filed Jun. 26, 2015, entitled "TEXTILE PATTERNING FOR SUBTRACTIVELY-PATTERNED SELF-ALIGNED INTERCONNECTS, PLUGS, AND VIAS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to interconnect structures for semiconductor devices and methods for manufacturing such devices.

BACKGROUND OF THE INVENTION

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIG. 1A is a perspective view of an interconnect layer with a hardmask layer that includes two different hardmask materials, according to an embodiment.

FIG. 1B is a perspective view of the interconnect layer of FIG. 1A after the formation of sacrificial cross-grating pattern over the two hardmask materials, according to an embodiment.

FIG. 1C is a perspective view of the interconnect layer of FIG. 1B after portions of the first and second hardmask materials have been removed and a textile patterned hardmask layer that includes four different hardmask materials has been formed, according to an embodiment.

FIG. 1D is a perspective view of the interconnect layer of FIG. 1C after the sacrificial cross-grating pattern has been removed, according to an embodiment.

FIG. 3I is a perspective view and a corresponding cross-sectional view of the interconnect layer of FIG. 3I after the recess has been filled with a dielectric material, according to an embodiment.

FIG. 4A is a perspective view of a plug opening formed through an interconnect layer, according to an embodiment.

FIG. 4B is a perspective view of a plug formed in the plug opening illustrated in FIG. 4A that allows for the four material textile patterned hardmask to be reformed, according to an embodiment.

FIG. 5A is a perspective view of an interconnect layer, according to an embodiment.

FIG. 5B is a cross-sectional view of the interconnect layer in FIG. 5A, according to an embodiment.

FIG. 5C is a cross-sectional view of the interconnect layer in FIG. 5B after a second metal layer is formed over the interconnect layer, according to an embodiment.

FIG. 5D is a cross-sectional view of the interconnect layer in FIG. 5C after the second metal layer is patterned according to an embodiment.

DETAILED DESCRIPTION OF THE INVENTION

Figure 2A:
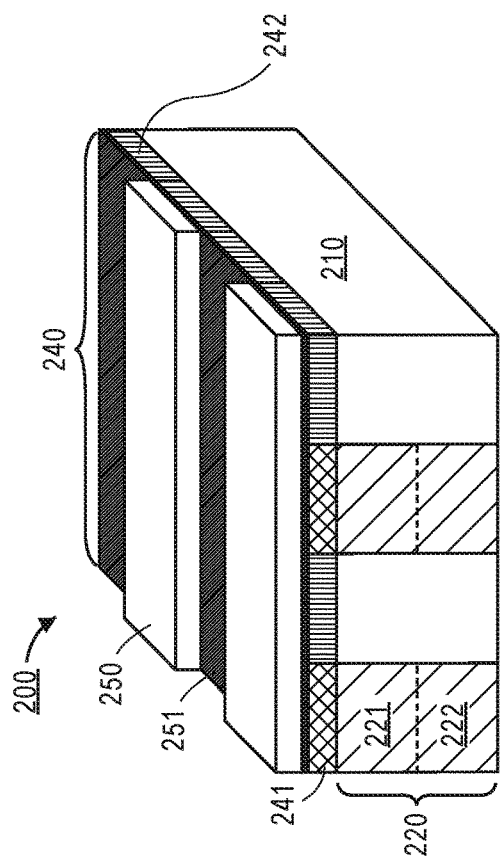
FIG. 2A is a perspective view of an interconnect layer with a hardmask layer that includes two different hardmask materials and is covered by a bimodal etchstop layer, according to an embodiment.

Described herein are systems that include a substrate with multiple layers with varying compositions and methods of depositing and patterning such layers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As described above, continued scaling of devices has necessitated that the critical dimension and the pitch of via openings formed in an interconnect layer decrease beyond the traditional capabilities of standard back end of line (BEOL) processing equipment. To overcome the limitations of the existing processing equipment, embodiments of the invention may utilize an interconnect layer that includes a textile patterned hardmask. As used herein, a textile patterned hardmask is a hardmask that includes an alternating pattern of two or more hardmask materials formed in a single layer. According to an embodiment, each of the hardmask materials may be selectively etched with respect to each other. For example, a textile patterned hardmask may include four different hardmask materials. In an embodiment, a textile patterned hardmask may be formed according to the processing operations illustrated in FIGS. 1A-1D.

Referring now to FIG. 1A, a perspective illustration of an interconnect layer 100 according to an embodiment is shown. As illustrated, the interconnect layer 100 includes conductive lines 120 and an interlayer dielectric (ILD) material 110 formed in an alternating pattern. According to an embodiment, the ILD material 110 may be a low-k or an ultra low-k dielectric material. By way of example, the ILD material 110 may include silicon dioxide, carbon doped silicon dioxide, porous silicon dioxide, silicon nitrides, or the like. By way of example, the conductive lines 120 may include Ag, Au, Co, Cu, Mo, Ni, NiSi, Pt, Ru, TiN, W, or the like. As illustrated, the conductive lines 120 may include a via portion 121 formed over an interconnect line portion 122. As such, each of the conductive lines 120 may have the potential to form a via 121 at any location. This allows for subtractive patterning to form the vias 121. Subtractively patterning vias 121 allows for the vias to be self-aligned over the interconnect lines 122. Subtractive patterning of the vias 121 is described in greater detail below. As illustrated, the interconnect line portion 121 is approximately half the overall thickness of the conductive lines 120 and the via portion 121 forms the remainder of the thickness of the conductive lines 120. However, embodiments of the invention are not limited to such configurations. For example, the thickness of the via portion 122 may be increased or decreased according to specific design constraints. In FIG. 1A the via portions 121 and the interconnect line portions 122 of the conductive lines 120 are separated by a dashed line. It is to be appreciated that the dashed line does not necessarily represent a perceivable border between the two portions. For example, the interconnect line portions 122 and the via portions 121 may be formed with the same material and be formed with a single deposition process. According to an embodiment, the formation of the conductive lines 120 and the ILD material 110 may include pitch-halving or pitch-quartering operations. For example the pitch-halving or pitch-quartering operations may be formed with spacer etching operations. Embodiments of the invention may form tightly pitched features that exceed the limits of the BEOL lithography equipment by using a spacer-etching process to form the conductive lines 120 and the ILD material 110.

In an embodiment, the interconnect layer 100 may be one layer in a BEOL-stack that includes a plurality of interconnect layers. As such, the interconnect layer 100 may be formed over another interconnect layer. Additional embodiments may include forming the interconnect layer 100 as the first interconnect layer over a semiconductor material on which one or more transistors or other devices are formed. Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

In FIG. 1A, a first portion of the textile patterned hardmask layer 140 is shown. As illustrated, the textile patterned hardmask layer 140 includes a first hardmask material 141 formed over the conductive lines 120 and a second hardmask material 142 formed over the ILD material 110. Embodiments of the invention include first and second hardmask materials 141, 142 that are etch selective to each other. By way of example, the hardmask materials 141, 142 may include SiOxCyNz materials, SiOXCY materials, metal oxide materials, metal nitride materials, or the like. According to an embodiment, the formation of the first and second hardmask materials 141, 142 may include pitch-halving or pitch-quartering operations. For example the pitch-halving or pitch-quartering operations may be formed with spacer etching operations.

Referring now to FIG. 1B, embodiments of the invention include forming a sacrificial cross-grating pattern 150 over the textile patterned hardmask layer 140. In an embodiment, the cross-grating pattern 150 is formed substantially orthogonal to the textile patterned hardmask layer 140, thereby exposing substantially square regions of each of the first hardmask material 141 and second hardmask material 142. According to an embodiment, the cross-grating pattern may be formed with pitch-halving or pitch-quartering operations. By way of example, the sacrificial cross-grating pattern 150 may have substantially the same pitch as the first and second hardmask materials 141, 142. Embodiments of the invention include a cross-grating pattern 150 that is formed from a material that is etch-selective to both the first and second hardmask materials 141, 142 in order to function as an etch mask for subsequent processing operations. By way of example, the sacrificial cross-grating pattern 150 may be a carbon hardmask material.

Referring now to FIG. 1C, a perspective illustration of the interconnect layer 100 after portions of the first and second hardmask materials 141, 142 are removed and replaced with third hardmask materials 143 and fourth hardmask materials 144, respectively, is shown according to an embodiment of the invention. In an embodiment, a first etching operation may selectively remove the exposed portions of the first hardmask material 141 and be followed with a deposition process that fills the openings caused by the removal of the first hardmask material 141 with a the third hardmask material 143. By way of example, the etching process may be a wet or dry etching process, and the deposition process may be any suitable process, such as physical vapor deposition (PVD), chemical vapor deposition (CVD), atomic layer deposition (ALD), or the like. Overburden of the third hardmask material 143 may then be recessed, (e.g., with an etching process) to provide a thickness of the third hardmask material 143 that is substantially similar to the thickness of the second hardmask material 142. Thereafter, a second etching operation may be used to selectively remove the exposed portions of the second hardmask material 141 and be followed with a deposition process that fills the openings caused by the removal of the second hardmask material 142 with the fourth hardmask material 144. By way of example, the etching process may be a wet or dry etching process, and the deposition process may be any suitable process, such as PVD, CVD, ALD, or the like. Overburden of the fourth hardmask material 144 may then be recessed, (e.g., with an etching process) to provide a thickness of the fourth hardmask material 144 that is substantially similar to the thickness of the third hardmask material 143. Accordingly, embodiments of the invention include a textile patterned hardmask layer 140 that is comprised of four different hardmask materials 141-144 that are substantially the same thickness.

Referring now to FIG. 1D, a perspective illustration of the interconnect layer 100 after the sacrificial cross-grating pattern 150 is removed is shown according to an embodiment of the invention. In an embodiment, the sacrificial cross-grating pattern 150 may be removed with an etching process, or with a polishing operation. As illustrated, the resulting textile patterned hardmask layer 140 now includes four hardmask materials 141-144 that are each etch selective to each other. The textile pattern in the illustrated embodiment is a checkered pattern. As such, the four borders of each hardmask material are adjacent to a hardmask material to which it is etch selective. For example, the first hardmask material 141 is bordered by the third hardmask material 143 on two opposite edges and by the second hardmask material 142 on the remaining edges.

According to an additional embodiment of the invention, the formation of a textile patterned hardmask layer may further comprise forming a bimodal etchstop layer over the first and second hardmask materials. Such embodiments allow for the etch-selectivity between the sacrificial cross-grating pattern and the first and second hardmask layers to be reduced. The formation of a textile patterned hardmask layer according to such an embodiment is illustrated in FIGS. 2A-2E.

Referring now to FIG. 2A, a perspective view of an interconnect layer 200 is shown according to an embodiment of the invention. The interconnect layer 200 is substantially similar to the interconnect layer 100 illustrated in FIG. 1A with the exception that a bimodal etchstop layer 251 is formed over the surface of the first hardmask material 241 and the second hardmask material 242. According to an embodiment, the bimodal etchstop layer 251 is a material that is removable with a wet-etching chemistry after it has been exposed to a dry etching chemistry. In an embodiment, the bimodal etchstop layer 251 may be a metal oxide material. For example, aluminum oxide is one such material that may be used for the bimodal etchstop layer 251.

Figure 2B:
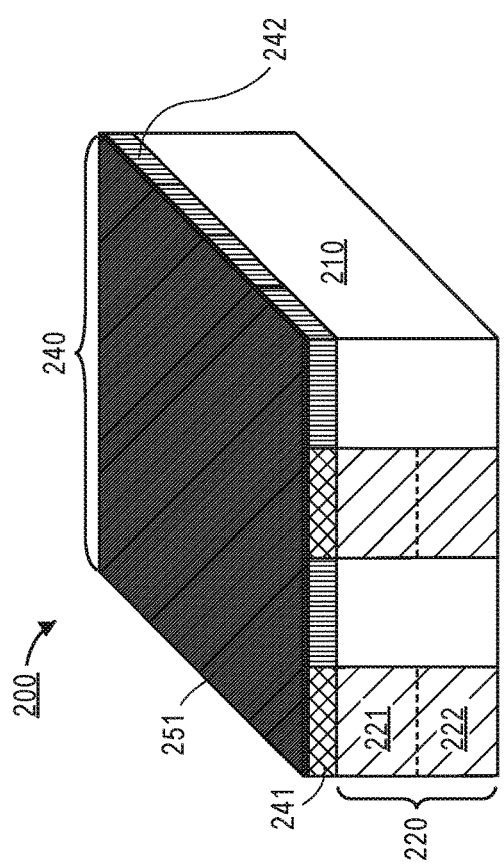
FIG. 2B is a perspective view of the interconnect layer of FIG. 2A after the formation of sacrificial cross-grating pattern over portions of the two hardmask materials and the bimodal etchstop layer, according to an embodiment.

Referring now to FIG. 2B, a perspective view of the interconnect layer 200 after the formation of the sacrificial cross-grating pattern 250 has been formed is shown according to an embodiment of the invention. The formation of the sacrificial cross-grating pattern 250 may be formed in substantially the same way as the sacrificial cross-grating pattern 150 is formed in FIG. 2B. During the formation of the sacrificial cross-grating pattern 250, the first and second hardmask materials 141, 142 are protected from being etched away by the bimodal etchstop layer 251. For example, the sacrificial cross-grating pattern 250 may be patterned with a dry-etching process (e.g., an ashing process with an oxygen plasma). The dry-etching process does not remove bimodal etchstop layer 251. Accordingly, the first and second hardmask materials 241, 242 remain protected by the bimodal etchstop layer 251 and are prevented from being removed by an etching process that is used to pattern the sacrificial cross-grating pattern 250. Furthermore, exposure to the plasma used in the patterning of the sacrificial cross-grating pattern renders the bimodal etchstop layer 251 susceptible to removal with a wet-etching chemistry.

Figure 2C:
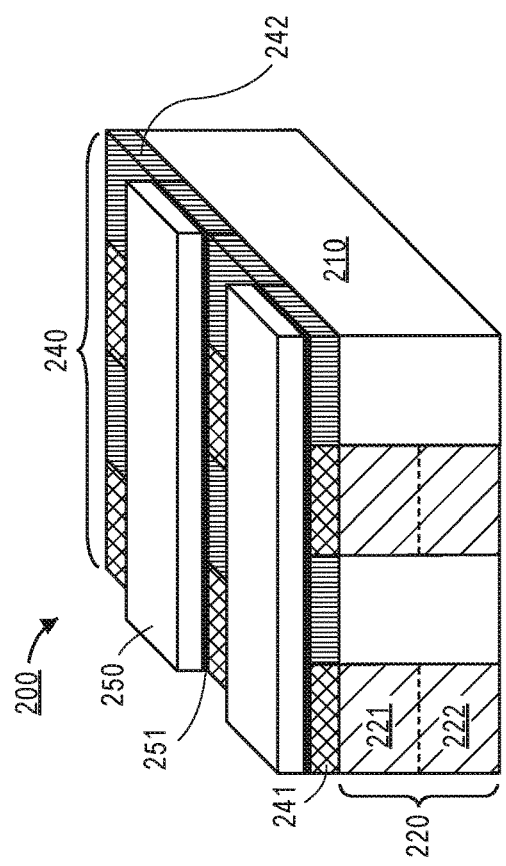
FIG. 2C is a perspective view of the interconnect layer of FIG. 2B after the exposed portions of the bimodal etchstop layer have been removed, according to an embodiment.

Referring now to FIG. 2C, a perspective view of the interconnect layer 200 after the bimodal etchstop layer 251 has been removed is shown according to an embodiment of the invention. According to an embodiment, the bimodal etchstop layer 251 may be removed with a wet-etching chemistry. In such embodiments, the first and second hardmask materials 241, 242 are not etched substantially by the wet-etching chemistry used to remove the bimodal etchstop layer 251. As such, portions of the first and second hardmask materials 241, 242 may be exposed between the sacrificial cross-grating pattern 250 even with limited etch-selectivity between the sacrificial cross-grating pattern 250 and the first and second hardmask materials 241, 242.

Figure 2D:
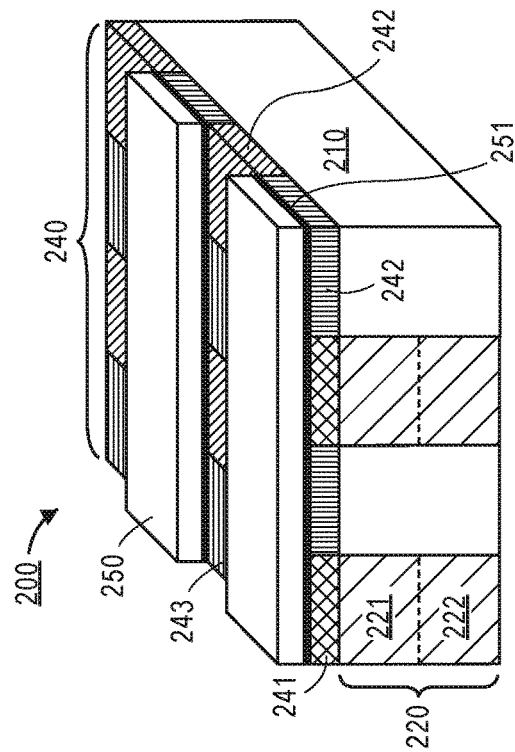
FIG. 2D is a perspective view of the interconnect layer of FIG. 2C after portions of the first and second hardmask materials have been removed and a textile patterned hardmask layer that includes four different hardmask materials has been formed, according to an embodiment.

Referring to FIG. 2D, a perspective view of the interconnect layer 200 after the exposed portions of the first and second hardmask materials 241, 242 are replaced with third hardmask materials 243 and fourth hardmask materials 244, respectively, are shown according to an embodiment of the invention. The replacement of the first and second hardmask materials 241, 242 may be performed in substantially the same manner as described with respect to FIG. 1C. For example, a first etching operation may selectively remove the exposed portions of the first hardmask material 241 and be followed with a deposition process that fills the openings caused by the removal of the first hardmask material 241 with a the third hardmask material 243. The third hardmask material 243 may then be recessed to be substantially the same thickness as the second hardmask material 242. Thereafter, a second etching operation may be used to selectively remove the exposed portions of the second hardmask material 241 and be followed with a deposition process that fills the openings caused by the removal of the second hardmask material 242 with the fourth hardmask material 244. The fourth hardmask material 244 may then be recessed to be substantially the same thickness as the third hardmask material 243. Accordingly, embodiments of the invention include a textile patterned hardmask layer 240 that is comprised of four different hardmask materials 241-244 that are substantially the same thickness.

Figure 2E:
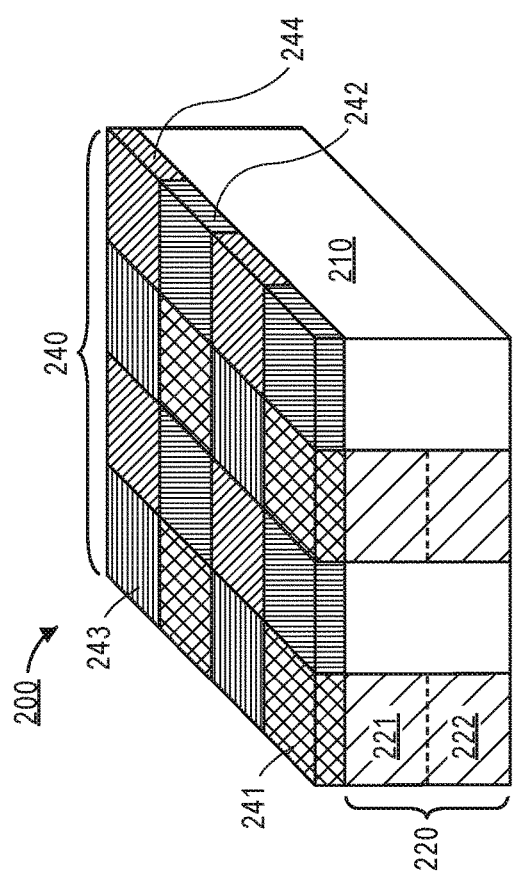
FIG. 2E is a perspective view of the interconnect layer of FIG. 2D after the sacrificial cross-grating pattern and the bimodal etchstop layer have been removed, according to an embodiment.

Referring now to FIG. 2E, a perspective illustration of the interconnect layer 200 after the sacrificial cross-grating layer 250 and the bimodal etchstop layer 251 are removed is shown according to an embodiment. Embodiments of the invention may include a two-part etching process to remove the sacrificial cross-grating layer 250 and the bimodal etchstop layer 251. According to an embodiment, the sacrificial cross-grating layer 250 may first be removed with an ashing process that includes an oxygen plasma. As such, the bimodal etchstop layer 251 is exposed to a plasma that renders the bimodal etchstop layer 251 susceptible to removal with a wet-etching chemistry. Thereafter, an etching process that utilizes a wet etching chemistry may be used to remove the remaining portions of the bimodal etchstop layer 251. Accordingly, an interconnect layer 200 with a textile patterned hardmask layer 240 substantially similar to the interconnect layer 100 described with respect to FIG. 1D is formed.

Embodiments of the invention that include a textile patterned hardmask layer, such as the ones described above allow for substantial benefits with respect to self-alignment of various features that are formed in an interconnect layer. Due to the self-alignment, the limitations of photolithography equipment and photoresist materials, such as those described above, do not prevent the formation of tightly pitched features and small critical dimensions (e.g., pitches that are less than 70 nm and critical dimensions that are less than 35 nm). For example, the use of lithography tools to align one layer to another inherently includes edge placement error. As such, embodiments of the invention are able to reliably pattern interconnect lines and vias that have pitches and critical dimensions that are that are smaller than the pitch and critical dimension limits presently achievable with known lithography processing operations. For example, substractively patterning vias and plugs in conjunction with textile patterned hardmask layers according to embodiments of the invention allow for the vias and plugs to be self-aligned with underlying interconnect lines. Additionally, substractively patterning vias and plugs with a textile patterned hardmask layer according to embodiments of the invention allows for the vias and plugs to be self-aligned with each other. Furthermore, after the vias and plugs of a given interconnect layer have been patterned, embodiments of the invention utilize the textile patterned hardmask layer to self-align a subsequently formed interconnect layer with the previous interconnect layer.

The process of forming substractively patterned vias and plugs that are self-aligned to an interconnect line with a textile patterned hardmask layer is illustrated with respect to FIGS. 3A-3I, according to embodiments of the invention.

Figure 3B:
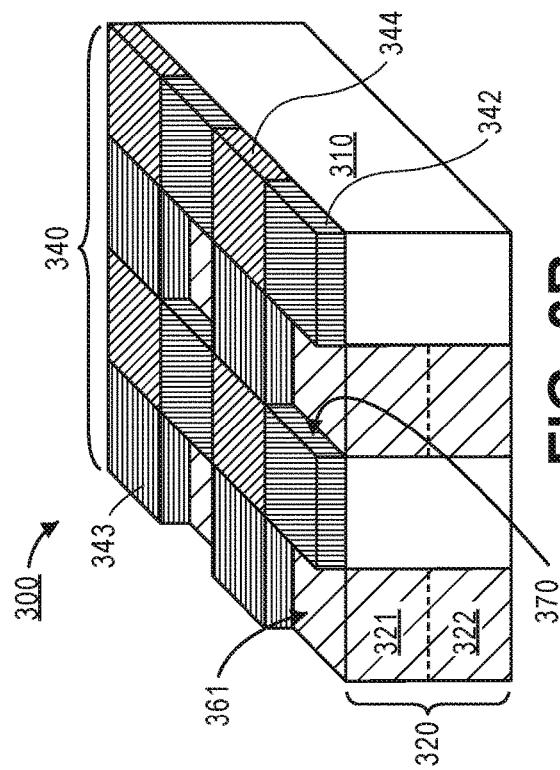
FIG. 3B is a perspective view of the interconnect layer of FIG. 3A after one of the four hardmask materials have been removed, according to an embodiment.
Figure 3A:
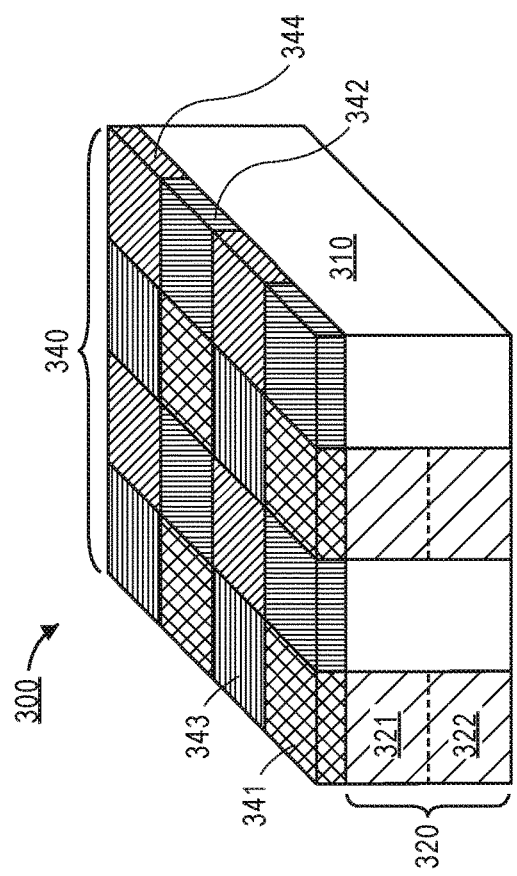
FIG. 3A is a perspective view of an interconnect layer that includes a textile patterned hardmask that includes four different hardmask materials, according to an embodiment.

Referring now to FIG. 3A, a perspective view of an interconnect layer 300 that includes a textile patterned hardmask layer 340 according to an embodiment of the invention is shown. As illustrated, the interconnect layer 300 includes conductive lines 320 and ILD material 310 formed in an alternating pattern. According to an embodiment, the ILD material 310 may be a low-k or an ultra low-k dielectric material. By way of example, the ILD material 310 may include silicon dioxide, carbon doped silicon dioxide, porous silicon dioxide, silicon nitrides, or the like. By way of example, the conductive lines may include conductive materials such as Ag, Au, Co, Cu, Mo, Ni, NiSi, Pt, Ru, TiN, W, or the like. As illustrated, the conductive lines 320 may include an interconnect line portion 322 and a via portion 321 formed over the interconnect line portion 322. As such, each of the conductive lines may have the potential to form a via 321 at any location. This allows for subtractive patterning to form the vias 321. Since the vias 321 will be substractively patterned, the vias will be self-aligned over the interconnect lines 322. As illustrated, the interconnect line portion 321 is approximately half the overall thickness of the conductive lines 320 and the via portion 321 forms the remainder of the thickness of the conductive lines 320. However, embodiments of the invention are not limited to such configurations. For example, the thickness of the via portion 322 may be increased or decreased according to specific design considerations. According to an embodiment, the formation of the conductive lines 320 and the ILD material 310 may include pitch-halving or pitch-quartering operations. For example the pitch-halving or pitch-quartering operations may be formed with spacer etching operations. In an embodiment, the interconnect layer 300 may be formed over another interconnect layer. Additional embodiments may include forming the interconnect layer 300 as the first interconnect layer over a semiconductor material on which one or more transistors or other devices are formed.

The interconnect layer in FIG. 3A also includes a textile pattern hardmask layer 340 formed over the top surfaces of the conductive lines 320 and the ILD material 310. According to an embodiment of the invention, the textile patterned hardmask layer 340 is substantially similar to the textile patterned hardmask layer described above with respect to FIG. 1D. Accordingly, embodiments of the invention include a textile patterned hardmask layer 340 that includes four hardmask materials 341-344 that are each etch selective to each other. The textile pattern in the illustrated embodiment is a checkered pattern. As such, the four borders of each hardmask material are adjacent to a hardmask material to which it is etch selective. For example, the first hardmask material 341 is bordered by the third hardmask material 343 on two opposite edges and by the second hardmask material 342 on the remaining edges.

Referring now to FIG. 3B, a perspective view of the interconnect layer 300 after the first hardmask material 341 has been removed is shown according to an embodiment. In an embodiment, the first hardmask material 341 is removed with an etching process that selectively removes only the first hardmask material 341. Accordingly, the etching process leaves the remaining hardmask materials 342-344 substantially the same thickness. The removal of the first hardmask material 341 produces first openings 361 through the textile patterned hardmask layer 340. As illustrated, the first openings 361 are self-aligned over the conductive lines 320. Accordingly, an etch-mask that has sidewalls 370 that are aligned with the sidewalls of the conductive lines 320 is formed.

Figure 3C:
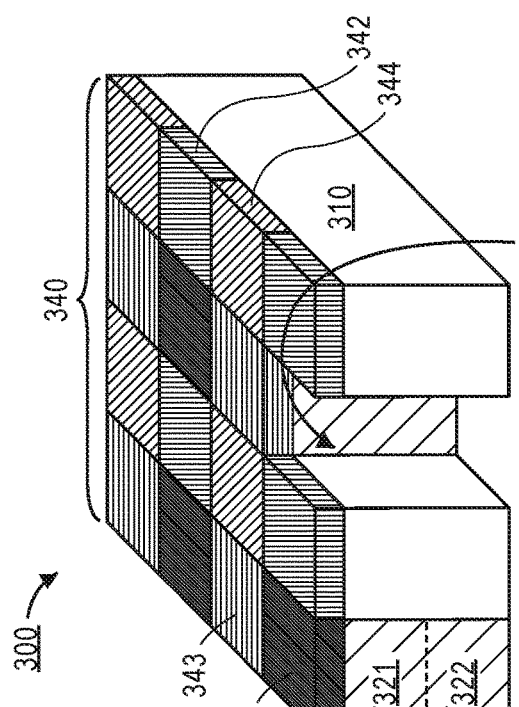
FIG. 3C is a perspective view of the interconnect layer of FIG. 3B after the openings in the hardmask layer have been filled with a photoresist material and patterned, according to an embodiment.

Referring now to FIG. 3C, a perspective view of the interconnect layer 300 after a photoresist material 380 has been deposited into each of the first openings 361 and patterned is shown according to an embodiment of the invention. According to an embodiment, the photoresist material 380 may be any suitable photoresist material. By way of example, the photoresist material may be a positive or negative photoresist material. Embodiments of the invention may include a chemically amplified photoresist (CAR) material. In an embodiment, the photoresist material 380 may be spun on to the interconnect layer 300. After the photoresist material 380 has been deposited, the photoresist material may be patterned to expose selected openings 361 where a plug opening 361P is desired. While a single plug opening is illustrated in FIG. 3C, it is to be appreciated that more than one plug opening may be formed according to embodiments of the invention. Furthermore, though not illustrated in FIG. 3C, embodiments of the invention may further comprise a metal recessing operation prior to the deposition of the photoresist material 380 in order to recess the exposed portions of the conductive lines 320. A metal recess operation such as this may reduce the possibility that the top surface of the conductive lines 320 may contact interconnect lines in a subsequently formed interconnect layer and create an unwanted short-circuit between conductive features.

Depositing the photoresist material 380 into the first openings 361 has several advantages. First, the sidewalls 370 reduce the need to control the line width roughness of the photoresist material 380. For example, once the photoresist material is cleared from the opening 361 (e.g., with a photoresist patterning operation) the sidewalls 370 of the textile patterned hardmask layer 340 serve as the etch mask instead of remaining portions of the photoresist material 380. Additionally, it is to be appreciated that each of the openings 361 are spaced apart from each other by remaining portions of the textile patterned hardmask 340. As such, the openings in a photomask (not shown) used to pattern the photoresist material do not need to be perfectly aligned with an opening 361 that is desired to be patterned. Therefore, the margin of error in the overlay between the photomask and the interconnect layer 300 is increased. For example, margin of error in the overlay may be twice as large or larger with respect to photolithography operations that form vias and plugs when a textile patterned hardmask layer is not used.

Figure 3D:
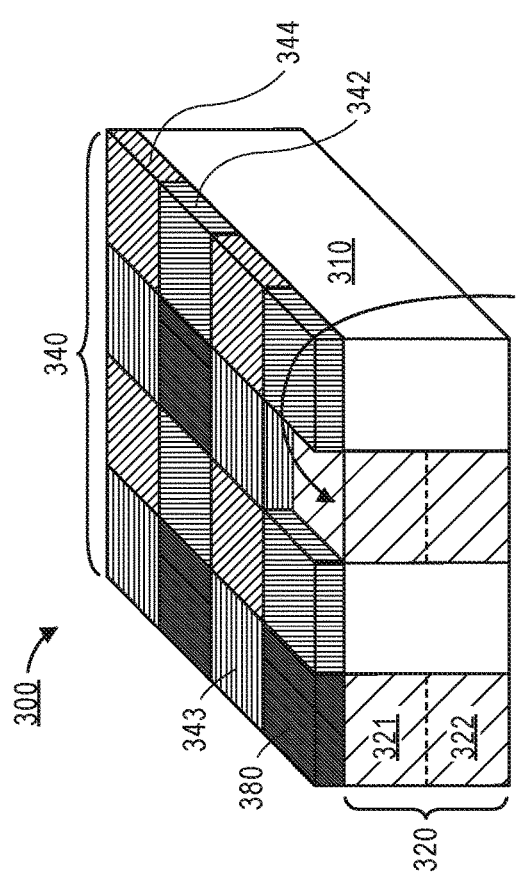
FIG. 3D is a perspective view of the interconnect layer of FIG. 3C after a plug opening has been etched through the interconnect layer, according to an embodiment.

Referring now to FIG. 3D, a perspective view of an interconnect layer 300 after a portion of the conductive line 320 below the plug opening 361P is removed is shown according to an embodiment of the invention. In an embodiment the portion of the conductive line 320 may be removed with an etching process. By way of example, the etching process may be a wet or dry etching process suitable for removing the material that forms the conductive line 320 and that is selective to the remaining hardmask materials in the textile patterned hardmask layer 340. As illustrated in FIG. 3D, the plug opening 361P is substantially aligned with the remaining portions of the conductive line 320 that are covered by the textile patterned hardmask layer 340 and the unpatterned photoresist material 380. Accordingly, embodiments of the invention reduce the risk of shorting between interconnect lines that may otherwise occur if the plug opening is misaligned with the conductive line 320.

Figure 3E:
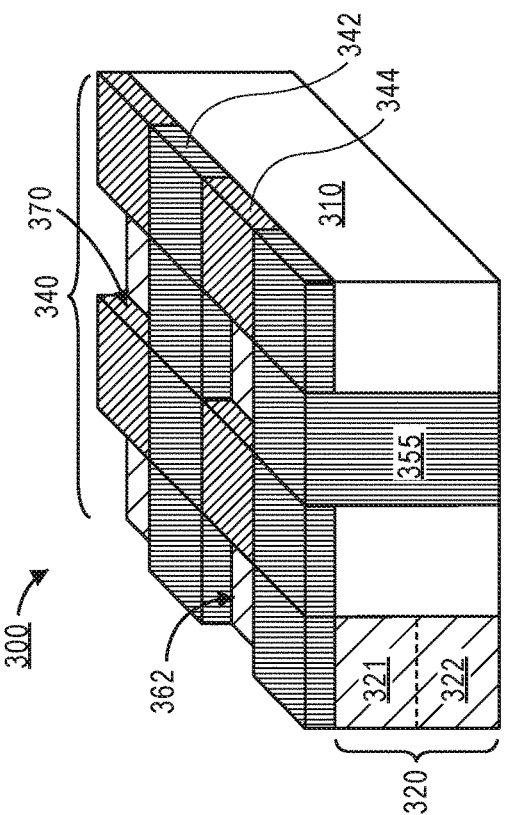
FIG. 3E is a perspective view of the interconnect layer of FIG. 3D after a plug has been formed in the plug opening, and the openings in the hardmask have been filled, according to an embodiment.

Referring now to FIG. 3E, a perspective view of an interconnect layer 300 after the photoresist material 380 has been removed and a plug 355 has been deposited in the plug opening 361P according to an embodiment of the invention. According to an embodiment, the plug 355 may be a suitable low-k or ultra low-k dielectric material. In the illustrated embodiment, the plug 355 may be formed with the same dielectric material that was used to from the second dielectric material 342 in the textile patterned hardmask layer 340. In an embodiment, the deposition process used to form the plug 355 is a blanket deposition process, and therefore, second dielectric material 342 may also be deposited in each of the openings 361. Embodiments of the invention include recessing the overburden from the deposition of the second dielectric material 342 such that the top surface of the second dielectric material 342 is substantially planar with the top surface of the textile patterned hardmask layer 340. As illustrated, the blanket deposition of the second dielectric material 342 allows for rows of the second dielectric material 342 to be reformed in the textile patterned hardmask layer 340.

Figure 3F:
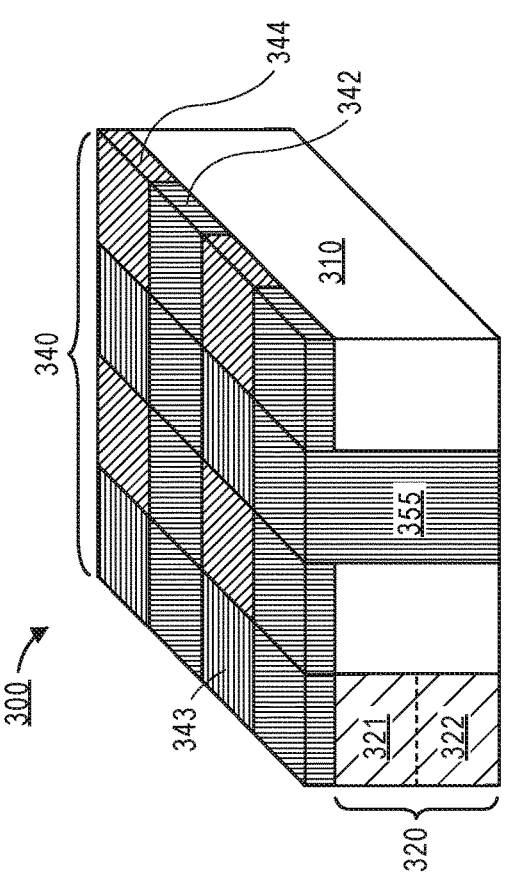
FIG. 3F is a perspective view of the interconnect layer of FIG. 3E after a second one of the four hardmask materials have been removed, according to an embodiment.

Referring now to FIG. 3F, a perspective view of an interconnect layer 300 after the third dielectric material 343 has been removed from the textile patterned hardmask layer 340 is shown according to an embodiment. In an embodiment, the third hardmask material 343 may be removed with an etching process that selectively removes the third hardmask material 343 while leaving the remaining portions of the textile patterned hardmask layer 340 behind. By way of example, the etching process may be a wet or dry etching process. Accordingly, second openings 362 may be formed through the textile patterned hardmask layer 340. Similar to the openings 361 described above, the second openings may be defined by sidewalls 370 that are aligned with the sidewalls of the conductive line 320.

Figure 3G:
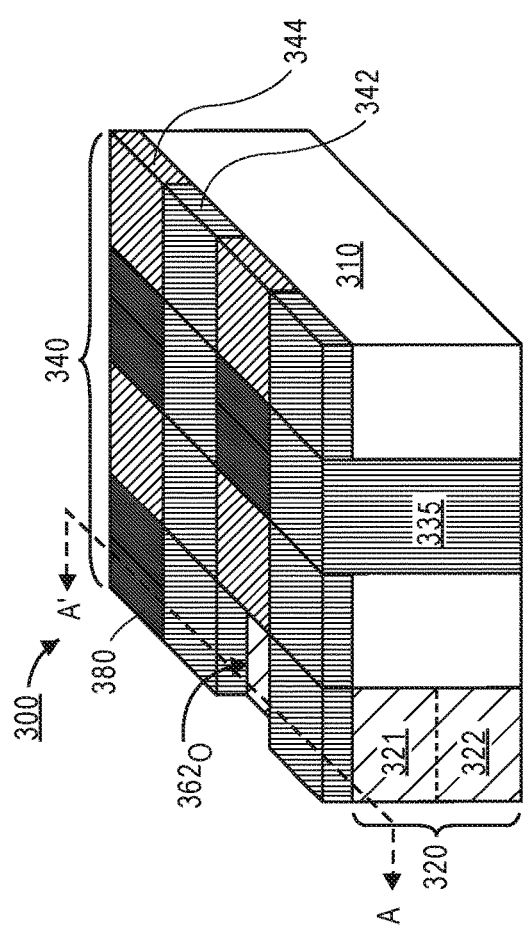
FIG. 3G is a perspective view and a corresponding cross-sectional view of the interconnect layer of FIG. 3F after the openings in the hardmask layer have been filled with a photoresist material and patterned, according to an embodiment.

Referring now to FIG. 3G a perspective view and a cross-sectional view along line A-A' of the perspective view are illustrated that show an interconnect layer 300 after photoresist material 380 has been deposited into each of the second openings 362 and selected second openings 362 are patterned to remove the photoresist material 380, according to an embodiment of the invention. According to an embodiment, the photoresist material 380 may be any suitable photoresist material, such as those described above. The photoresist material 380 may be spun on to the interconnect layer 300. After the photoresist material 380 has been deposited, the photoresist material may be patterned to expose selected second openings 362 where a via opening 362o is desired. While a single via opening is illustrated in FIG. 3G, it is to be appreciated that more than one via opening may be formed according to embodiments of the invention. Furthermore, though not illustrated in FIG. 3G, embodiments of the invention may further comprise a metal recessing operation performed prior to the deposition of the photoresist material 380 in order to recess the exposed portions of the conductive lines 320. A metal recess operation such as this may reduce the possibility that the top surface of the conductive lines 320 may contact a subsequent interconnect lines in a subsequently formed interconnect layer and create an unwanted short-circuit between conductive features.

As illustrated in the cross-sectional view along line A-A' the conductive line 320 includes an interconnect line portion 322 and a via portion 321 along the entire length of the conductive line 320. Accordingly, a via 321 may be formed at any desired location along the conductive line 320. The vias 321 are formed by covering portions of the conductive line 320 wherever a via 321 is desired. For example, the via opening 362o is formed where the via portion 321 is desired to be removed. This process of removing via portions 321 in order to define the vias 321 that are desired to remain in the final device may be referred to herein as subtractive via patterning.

Figure 3H:
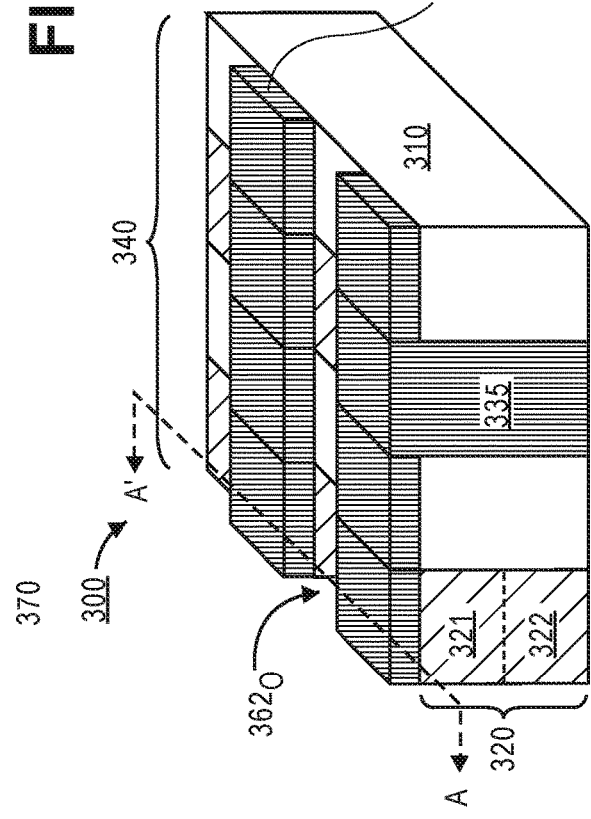
FIG. 3H is a perspective view and a corresponding cross-sectional view of the interconnect layer of FIG. 3G after a recess has been formed in the interconnect layer, according to an embodiment.

Referring now to FIG. 3H, a perspective view and a cross-sectional view along line A-A' of the perspective view are illustrated that show an interconnect layer 300 after the via portion 321 of the conductive line 320 is removed in the opening 362o, according to an embodiment of the invention. According to an embodiment, the conductive line may be etched with a wet or dry etching process. Subsequent to the removal of the via portion 321 in the opening 362o, the photoresist material may be removed (e.g., with an ashing process) and the forth dielectric material 344 may be removed (e.g., with a wet or dry etching process).

Referring now to FIG. 3I, a perspective view and a cross-sectional view along line A-A' of the perspective view are illustrated that show the interconnect layer 300 after the opening 362o has been filled with a dielectric material 311. By way of example, the dielectric material 311 may be the same dielectric material used to form the ILD 310 material. Thereafter, any overburden of the dielectric material 311 may be recessed such that a top surface of the dielectric fill material 311 is substantially coplanar with the neighboring conductive lines 320, according to an embodiment. As illustrated, the lines of the second dielectric material 342 may extend above portions of the interconnect layer 300, and may be visible in a finished microelectronic device, according to an embodiment. Such embodiments may be beneficial for several reasons. First, the second dielectric material 342 may increase the shorting margins between interconnect lines in a subsequently formed interconnect layer. Additionally, the second dielectric material 342 may function as a template that allows for aligning subsequently formed interconnect layers. Examples of each of these benefits will be described in greater detail below.

According to an additional embodiment of the invention, the textile patterned hardmask layer may be returned to a four-material checkered hardmask layer after each iteration of etching through the conductive lines (either for the formation of plugs 355 or for the definition of vias 321). Such an embodiment is described with respect to FIGS. 4A-4B.

Referring now to FIG. 4A, a perspective view of an interconnect layer 400 after a portion of the conductive line 420 below a plug opening $461_p$ is removed is shown according to an embodiment of the invention. The interconnect layer 400 illustrated in FIG. 4A may be formed in substantially the same manner as the interconnect structure 300 illustrated in FIG. 3D. Referring now to FIG. 4B, a perspective view of an interconnect layer 400 after the plug 455 has been formed is shown according to an embodiment of the invention. Unlike the plug 355 formed in FIG. 3E, the plug 455 in FIG. 4B is formed with the first dielectric material 441. Additionally, the first openings that are formed when the photoresist material 480 is removed are refilled with the first dielectric material 441 during the formation of the plug 455. Therefore, the textile patterned hardmask layer 440 is returned to a four-material checkered pattern. Accordingly, self-aligned subtractive patterning may be repeated as many times as necessary in order to form plugs and vias at desired locations.

As described above with respect to FIG. 3I, embodiments of the invention may further utilize portions of the second dielectric material that extend above the dielectric lines and the conductive lines in order to increase the shorting margin of interconnect lines formed in the next interconnect layer. Such an embodiment is described with respect to FIGS. 5A-5D.

Referring now to FIG. 5A, a perspective view of an interconnect layer 500 is illustrated according to an embodiment of the invention. As illustrated, the interconnect layer 500 includes a plug 555. Additionally, FIG. 5B illustrates a cross-sectional view along line B-B' in FIG. 5A and shows that vias 521 are separated by a dielectric fill material 511. The plug 555 and the dielectric fill material 511 that defines vias 521 may be formed with processing operations similar to those described above with respect to FIGS. 3A-3I. As illustrated in FIGS. 5A and 5B, the second dielectric material 542 extends above the top surfaces of the dielectric lines 510 and the conductive lines 520.

Referring now to FIG. 5C, a cross-sectional illustration along line B-B' of an interconnect layer 500 after the deposition of a subsequent conductive layer 528 is shown according to an embodiment of the invention. By way of example, the subsequent conductive layer 528 may be a metallic material (e.g., Ag, Au, Co, Cu, Mo, Ni, NiSi, Pt, Ru, TiN, W, or the like) or a semiconductive material (e.g., silicon, a doped silicon, or the like). In order to allow for subtractive patterning in the subsequent conductive layer 528, embodiments of the invention include depositing the subsequent conductive layer 528 to have a thickness T suitable for forming both the subsequent interconnect lines 525 and the subsequent vias 524. By way of example, the thickness T may be on approximately the same value as the pitch between interconnect lines 522, though embodiments are not limited to such configurations. For example, the thickness T may be greater than or less than the pitch between interconnect lines.

Referring now to FIG. 5D, a cross-sectional illustration along line B-B' of an interconnect layer 500 after the subsequent conductive layer 528 has been patterned to form individual conductive lines 523 is shown according to an embodiment of the invention. According to embodiments of the invention, the conductive lines 523 may be misaligned from the vias 521. However, risk of short circuiting to underlying circuitry is minimized because the second dielectric material 542 increases the shorting margin M. Accordingly, even when the subsequent layer is misaligned, the presence of the second dielectric material 542 decreases the possibility of a short circuit between interconnect layers.

As described above with respect to FIG. 3I, embodiments of the invention may further utilize portions of the second dielectric material that extend above the dielectric lines and the conductive lines as a template in order to self-align the subsequently formed interconnect layer. Such an embodiment is described with respect to FIGS. 6A-6B.

Figure 6B:
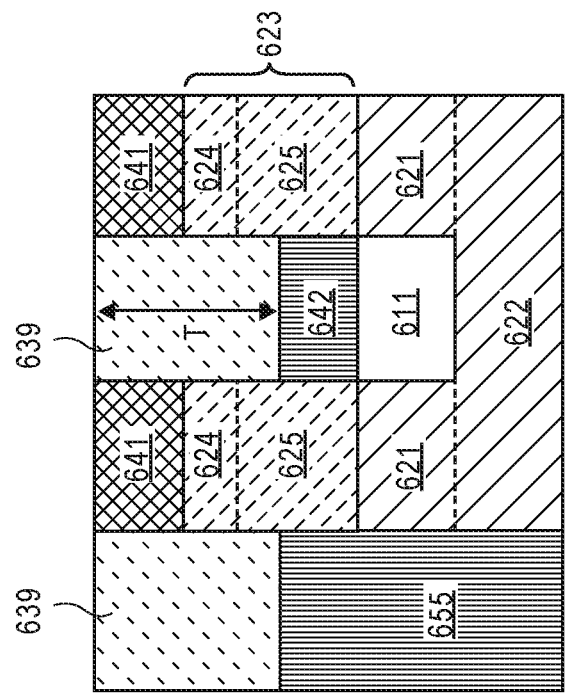
FIG. 6B is a cross-sectional view of the interconnect layer in FIG. 6A after second conductive lines have been formed, according to an embodiment.
Figure 6A:
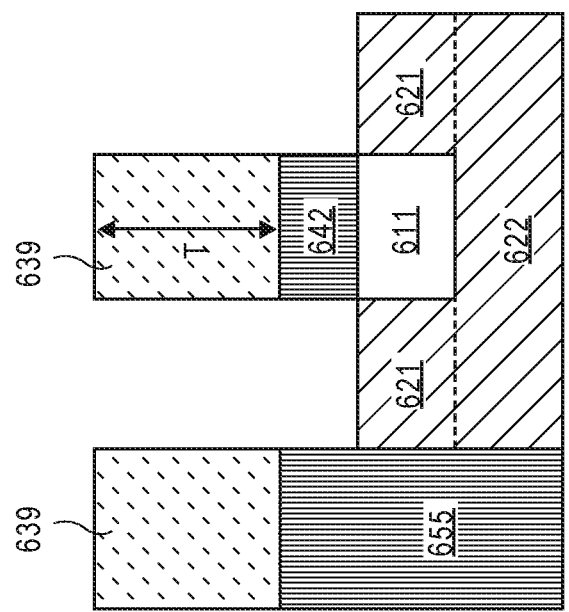
FIG. 6A is a cross-sectional view of the interconnect layer after an extension layer is formed over the exposed portions of a hardmask material, according to an embodiment.

Referring now to FIG. 6A, a cross-sectional illustration of an interconnect layer 600 is shown according to an embodiment of the invention. The interconnect layer 600 is substantially similar to the interconnect layer 500 illustrated in FIG. 5B with the exception that an extension layer 639 is formed over the second dielectric material 642. According to an embodiment, the extension layer 639 is selectively formed over the second dielectric material 642 with a selective growth process that uses the topography of the second dielectric material 642 (i.e., the difference in height between the second dielectric material 642 and the height of the conductive lines 320) or with a directed self-assembly (DSA) process that utilizes the differences in materials that form the layers. By way of example, DSA processes may be implemented with a diblock copolymer, such as polystyrene-b-polymethylmethacrylate (PS-b-PMMA). Additional embodiments may utilize self-segregating combinations of homopolymers. Embodiments may also utilize polymer brushes selectively anchored to one of the materials to guide DSA processes. According to an embodiment, the extension layer 639 has a thickness T that allows for the deposition of a subsequent conductive line 623 that is thick enough to form the next layer vias 625, the next layer interconnect lines 624, and the next layer hardmask 641.

Referring now to FIG. 6B, a cross-sectional illustration of an interconnect layer 600 after the next layer conductive lines 623 and the next layer hardmask 645 have been formed. According to an embodiment, the next layer conductive lines 623 may be formed with a blanket deposition process of a metal (e.g., Ag, Au, Co, Cu, Mo, Ni, NiSi, Pt, Ru, TiN, W, or the like) or a semiconductor material (e.g., silicon, doped silicon, or the like). After the blanket deposition, the next layer conductive lines 623 may be recessed and the next layer hardmask 641 may be deposited and planarized with the top surface of the extension layer 639. In an embodiment, the extension layer 639 and the next layer hardmask 641 may then be further patterned to form a textile patterned hardmask with four hardmask materials, such as those described above. In an embodiment, the extension layer 639 may also be etched away and replaced with a different dielectric material that may be useful for forming the textile patterned hardmask.

As illustrated in FIG. 6B, the next layer conductive lines are self-aligned with the vias 621 of the lower interconnect layer. As illustrated, the sidewalls of the next layer conductive lines 623 are aligned with the sidewalls of the vias 621. Accordingly, overlay error between the interconnect layers may be reduced or eliminated, and the fabrication of an interconnect layer stack (i.e., the BEOL-stack) is not dependent on limitations of photolithography equipment.

Figure 7:
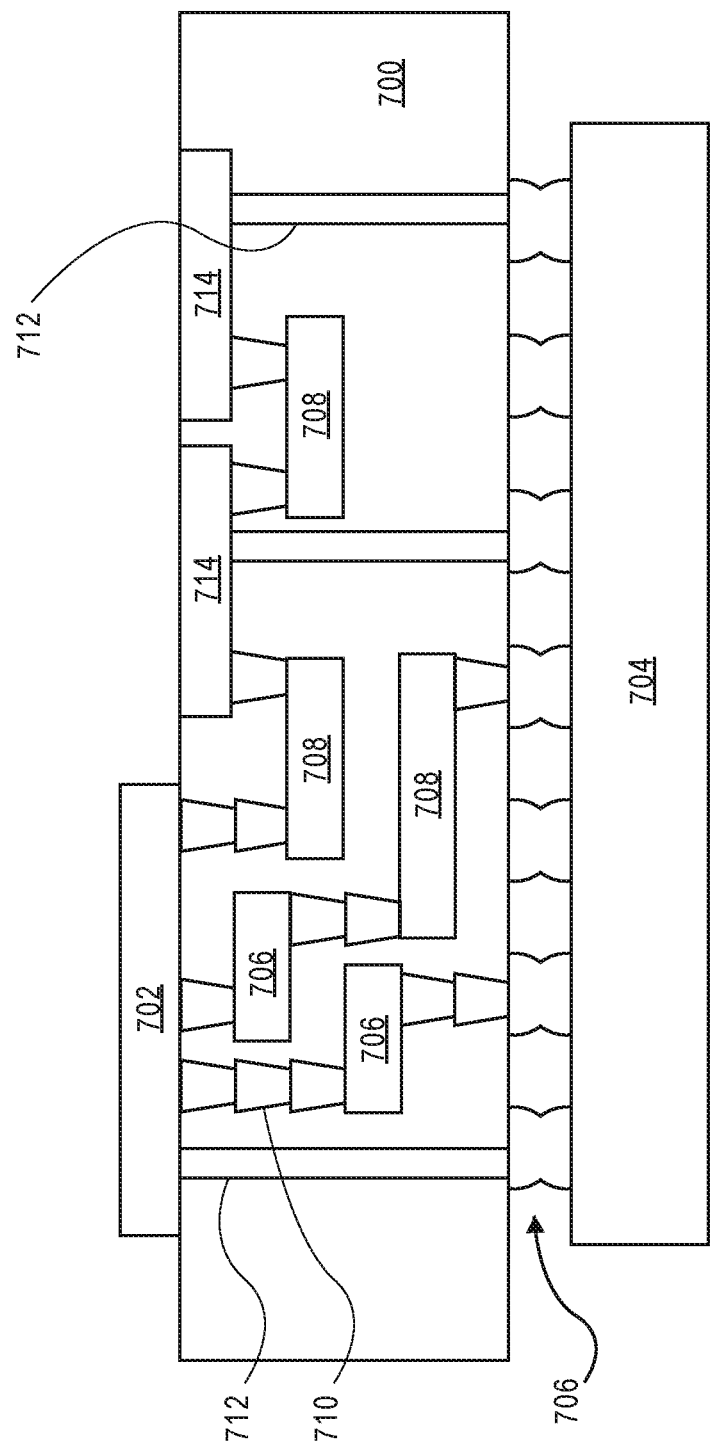
FIG. 7 is a cross-sectional illustration of an interposer implementing one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

In accordance with embodiments of the invention, apparatuses that include subtractively patterned self-aligned interconnects plugs and vias formed with a textile patterned hardmask or processes for forming such devices disclosed herein may be used in the fabrication of interposer 700.

Figure 8:
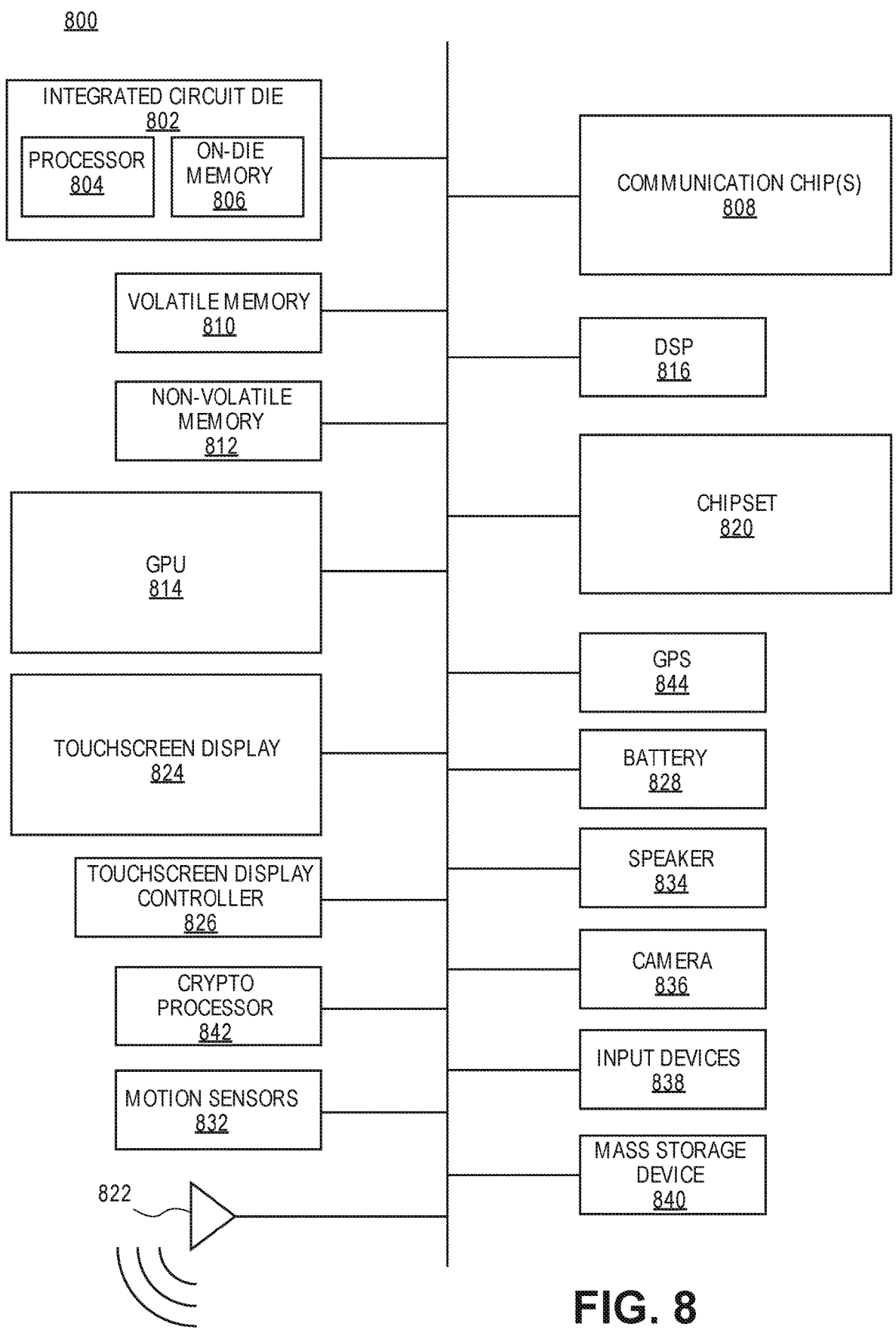
FIG. 8 is a schematic of a computing device built in accordance with an embodiment of the invention.

FIG. 8 illustrates a computing device 800 in accordance with one embodiment of the invention. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 828 or other power source, a power amplifier (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The processor 804 of the computing device 800 includes one or more devices, such as transistors that are coupled to one or more self-aligned interconnect lines, vias, or plugs that are formed in an interconnect structure that that are formed with a subtractive patterning operation that utilizes a textile patterned hardmask layer, according to an embodiment of the invention. The term "processor" may refer to any device or portion of a device that processes electronic data from registers and/or memory to transform that electronic data into other electronic data that may be stored in registers and/or memory.

The communication chip 808 may also include one or more devices, such as transistors that are coupled to one or more self-aligned interconnect lines, vias, or plugs that are formed in an interconnect structure that that are formed with a subtractive patterning operation that utilizes a textile patterned hardmask layer, according to an embodiment of the invention.

In further embodiments, another component housed within the computing device 800 may contain one or more devices, such as transistors that are coupled to one or more self-aligned interconnect lines, vias, or plugs that are formed in an interconnect structure that that are formed with a subtractive patterning operation that utilizes a textile patterned hardmask layer, according to an embodiment of the invention.

In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a method of forming a textile patterned hardmask, comprising: forming a first hardmask material and a second hardmask material over a top surface of an interconnect layer in an alternating pattern, wherein the first hardmask material and the second hardmask material are etch selective to each other; forming a sacrificial cross-grating over the first and second hardmask materials; etching through portions of the first hardmask material that are not covered by the sacrificial cross-grating to form first openings; disposing a third hardmask material into the first openings, wherein the third hardmask material is etch selective to the first and the second hardmask materials; etching through portions of the second hardmask material that are not covered by the sacrificial cross-grating to form second openings; disposing a fourth hardmask material into the second openings, wherein the fourth hardmask material is etch selective to the first, the second, and the third hardmask materials; and removing the sacrificial cross-grating.

Additional embodiments include a method for forming a textile patterned hardmask that further comprises: forming a bimodal etchstop layer over the first and second hardmask materials prior to forming the sacrificial cross-grating, wherein the bimodal etchstop layer is removable with a wet-etching chemistry after it has been exposed to a dry etching chemistry.

Additional embodiments include a method for forming a textile patterned hardmask, wherein the forming the sacrificial cross-grating comprises: depositing a sacrificial mask layer over the top surface of the bimodal etchstop layer; patterning the sacrificial mask layer with a dry-etching process to form the sacrificial cross-grating; and removing the bimodal etchstop layer with a wet-etching chemistry.

Additional embodiments include a method for forming a textile patterned hardmask, wherein the first, second, third, and fourth hardmask materials are each different materials selected from a group of SiOXCYNZ materials, SiOXCY materials, metal oxide materials, and metal nitride materials.

Additional embodiments include a method for forming a textile patterned hardmask, wherein the sacrificial cross grating is formed from a material that is etch selective to the first and second hardmask materials.

Additional embodiments include a method for forming a textile patterned hardmask, wherein the sacrificial cross grating is a carbon hardmask material.

Embodiments of the invention include an interconnect structure comprising: an interlayer dielectric (ILD) material; an interconnect line formed adjacent to the ILD material; and one or more vias formed over a top surface of the interconnect line, wherein a sidewall of the via is aligned with a sidewall of the interconnect line, and wherein portions of the top surface of the interconnect line that are not covered by a via are covered by a dielectric fill material.

Additional embodiments include an interconnect structure, further comprising one or more dielectric lines formed over a top surface of the ILD material, wherein the dielectric lines extend in a direction orthogonal to a direction the interconnect line extends.

Additional embodiments include an interconnect structure, wherein one of the plurality of dielectric lines passes over a top surface of the dielectric fill material.

Additional embodiments include an interconnect structure, wherein a first dielectric line includes a sidewall that is aligned with a first sidewall of a first via, and wherein a second dielectric line includes a sidewall that is aligned with a second sidewall of the first via that is opposite to the first sidewall of the first via.

Additional embodiments include an interconnect structure, further comprising an extension layer formed over a top surface of the first dielectric line and a top surface of the second dielectric line.

Additional embodiments include an interconnect structure, further comprising a second interconnect line formed over the first via and between the first dielectric line and the second dielectric line.

Additional embodiments include an interconnect structure, wherein the extension layer is formed with a directed self-assembly (DSA) process.

Additional embodiments include an interconnect structure, wherein the extension layer is one block of a diblock copolymer.

Additional embodiments include an interconnect structure, further comprising a second interconnect line formed partially above one of the dielectric lines and partially over the first via.

Additional embodiments include an interconnect structure, wherein a first of the dielectric lines is formed over the dielectric fill material, and wherein a second interconnect line is formed partially over the first dielectric line and partially over the ILD material.

Additional embodiments include an interconnect structure, further comprising a dielectric plug adjacent to the interconnect line, wherein a sidewall of the interconnect line is aligned with a sidewall of the dielectric plug.

Additional embodiments include an interconnect structure, wherein the dielectric fill material is the same material as the ILD material.

Embodiments of the invention include a method of forming self-aligned features in an interconnect layer, comprising: forming first mask openings in a hardmask layer formed over the interconnect layer that includes four hardmask materials arranged in a checkered pattern by removing a first hardmask material with a first etching process; depositing a photoresist material in the first mask openings; removing the photoresist material from one or more of the openings with a photoresist patterning process to expose a top surface of a conductive line in the interconnect layer, wherein the conductive line includes a via portion formed over an interconnect line portion; removing the exposed via portion with an etching process; and depositing a dielectric fill material into the opening to replace the removed portion of the conductive line.

Additional embodiments include a method of forming self-aligned features in an interconnect layer, wherein the first hardmask material and a third hardmask material of the hardmask layer are formed in an alternating pattern along the top surface of the conductive line, and wherein a second hardmask material and a fourth hardmask material of the hardmask layer are formed in an alternating pattern along a top surface of an interlayer dielectric (ILD) material formed in the interconnect layer.

Additional embodiments include a method of forming self-aligned features in an interconnect layer, wherein a first sidewall of the dielectric fill material is aligned with a first sidewall of the conductive line, and wherein a second sidewall of the dielectric fill material is aligned with a second sidewall of the conductive line.

Additional embodiments include a method of forming self-aligned features in an interconnect layer, wherein the first, second, third, and fourth hardmask materials are etch selective to each other.

Additional embodiments include a method of forming self-aligned features in an interconnect layer, wherein the first, second, third, and fourth hardmask materials are each different materials selected from a group of SiOXCYNZ materials, SiOXCY materials, metal oxide materials, and metal nitride materials.

Additional embodiments include a method of forming self-aligned features in an interconnect layer, further comprising: removing the interconnect line portion below the removed via portion, wherein the dielectric fill material forms a plug that completely intersects the conductive line.

Additional embodiments include a method of forming self-aligned features in an interconnect layer, wherein the dielectric fill material is the same material as the first dielectric material.

What is claimed is:

1. A method of forming a textile patterned hardmask, comprising:
   forming a first hardmask material and a second hardmask material over a top surface of an interconnect layer in an alternating pattern, wherein the first hardmask material and the second hardmask material are etch selective to each other;
   forming a sacrificial cross-grating over the first and second hardmask materials;
   etching through portions of the first hardmask material that are not covered by the sacrificial cross-grating to form first openings;

disposing a third hardmask material into the first openings, wherein the third hardmask material is etch selective to the first and the second hardmask materials;

etching through portions of the second hardmask material that are not covered by the sacrificial cross-grating to form second openings;

disposing a fourth hardmask material into the second openings, wherein the fourth hardmask material is etch selective to the first, the second, and the third hardmask materials; and removing the sacrificial cross-grating.

2. The method of claim 1, further comprising:

forming a bimodal etchstop layer over the first and second hardmask materials prior to forming the sacrificial cross-grating, wherein the bimodal etchstop layer is removable with a wet-etching chemistry after it has been exposed to a dry etching chemistry.

3. The method of claim 2, wherein the forming the sacrificial cross-grating comprises:

depositing a sacrificial mask layer over the top surface of the bimodal etchstop layer;

patterning the sacrificial mask layer with a dry-etching process to form the sacrificial cross-grating; and removing the bimodal etchstop layer with a wet-etching chemistry.

4. The method of claim 1, wherein the first, second, third, and fourth hardmask materials are each different materials selected from a group of $SiO_xC_yN_z$ materials, $SiO_XC_Y$ materials, metal oxide materials, and metal nitride materials.

5. The method of claim 1, wherein the sacrificial cross grating is formed from a material that is etch selective to the first and second hardmask materials.

6. The method of claim 5, wherein the sacrificial cross grating is a carbon hardmask material.

* * * * *